(12) United States Patent
Kunishige et al.

(10) Patent No.: US 12,230,548 B2
(45) Date of Patent: Feb. 18, 2025

(54) SEMICONDUCTOR DEVICE

(71) Applicant: Mitsubishi Electric Corporation, Tokyo (JP)

(72) Inventors: Yuri Kunishige, Tokyo (JP); Hiroyuki Nakano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 382 days.

(21) Appl. No.: 17/753,719

(22) PCT Filed: Oct. 23, 2019

(86) PCT No.: PCT/JP2019/041486
§ 371 (c)(1),
(2) Date: Mar. 11, 2022

(87) PCT Pub. No.: WO2021/079427
PCT Pub. Date: Apr. 29, 2021

(65) Prior Publication Data
US 2022/0344229 A1    Oct. 27, 2022

(51) Int. Cl.
*H01L 23/58*       (2006.01)
*H01L 23/31*       (2006.01)
(Continued)

(52) U.S. Cl.
CPC ...... *H01L 23/3107* (2013.01); *H01L 29/1608* (2013.01); *H01L 29/66545* (2013.01)

(58) Field of Classification Search
None
See application file for complete search history.

(56) References Cited

U.S. PATENT DOCUMENTS

2011/0241178 A1\* 10/2011 Miki ............ H01L 23/585
257/E23.116
2016/0163463 A1\*  6/2016 Namikawa ........ H01G 4/008
361/301.3
(Continued)

FOREIGN PATENT DOCUMENTS

JP     S63-037623 A      2/1988
JP     2006-318988 A    11/2006
(Continued)

OTHER PUBLICATIONS

International Search Report issued in PCT/JP2019/041486; mailed Dec. 24, 2019.
(Continued)

*Primary Examiner* — Joseph C. Nicely
*Assistant Examiner* — Lamont B Koo
(74) *Attorney, Agent, or Firm* — Studebaker & Brackett PC

(57) ABSTRACT

A semiconductor device includes a semiconductor substrate, an electrode and a wire disposed on the semiconductor substrate, and a protective film covering the semiconductor substrate. The protective film includes a main protective film covering at least portion of the electrode and at least portion of the wire, and a dummy protective film independently disposed at each of corners of the semiconductor substrate. The main protective film has a chamfer at each of the corners of the semiconductor substrate in plan view. The dummy protective film is disposed outside the chamfer to be spaced from the main protective film.

8 Claims, 5 Drawing Sheets

(51) Int. Cl.
  *H01L 29/16*   (2006.01)
  *H01L 29/66*   (2006.01)

(56) References Cited

U.S. PATENT DOCUMENTS

2018/0190605 A1* 7/2018 Hamaguchi ............. H01L 24/05
2018/0197950 A1* 7/2018 Natsume ............... H01L 23/562

FOREIGN PATENT DOCUMENTS

| JP | 2006-318989 A | 11/2006 |
|----|---------------|---------|
| JP | 2008-300500 A | 12/2008 |
| JP | 2011-216753 A | 10/2011 |
| JP | 2014-096488 A | 5/2014  |

OTHER PUBLICATIONS

An Office Action mailed by the German Patent Office on Jun. 5, 2024, which corresponds to German Patent Application No. 11 2019 007 838.0 and is related to U.S. Appl. No. 17/753,719; with English language translation.

An Office Action; mailed by the China National Intellectual Property Administration of the People's Republic of China on Oct. 22, 2024, which corresponds to Chinese Patent Application No. 201980101450.0 and is related to U.S. Appl. No. 17/753,719.

\* cited by examiner

F I G. 1
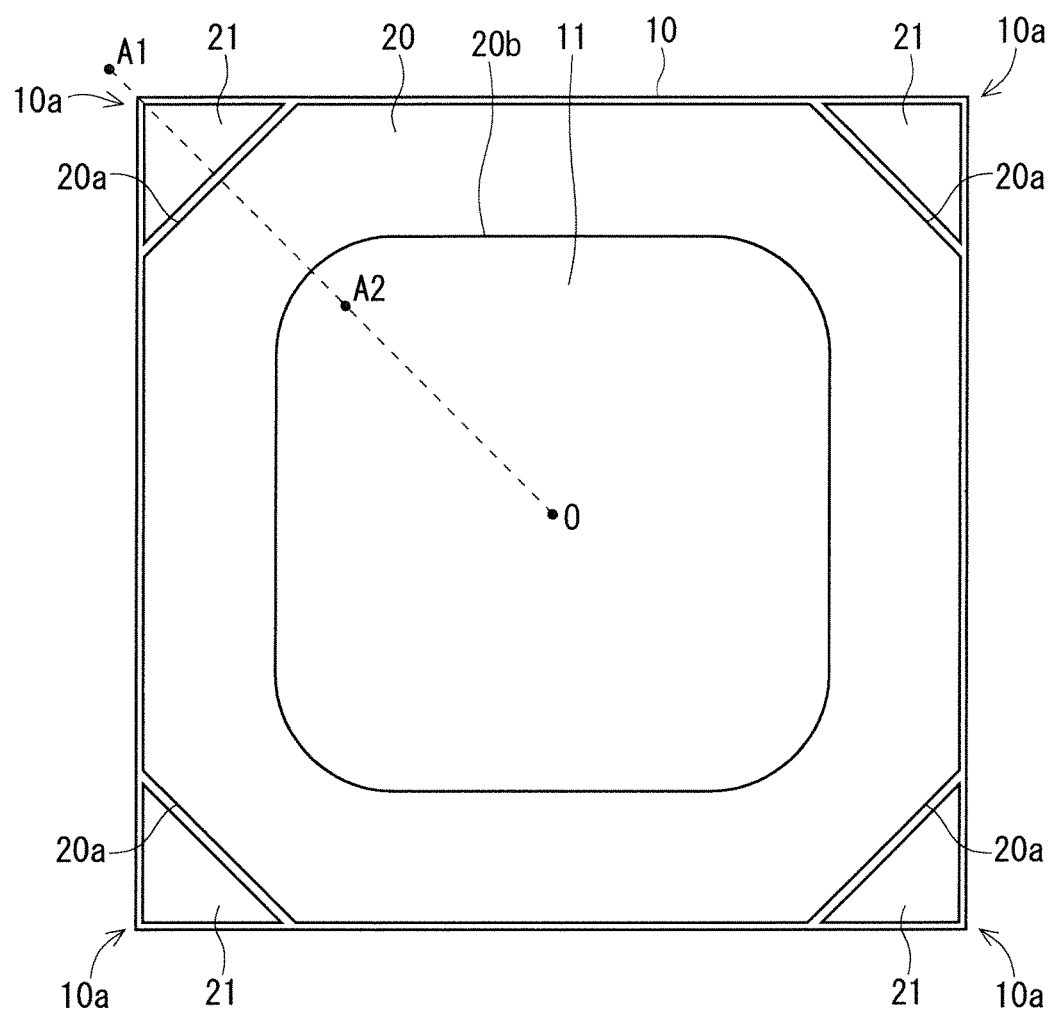

F I G. 3
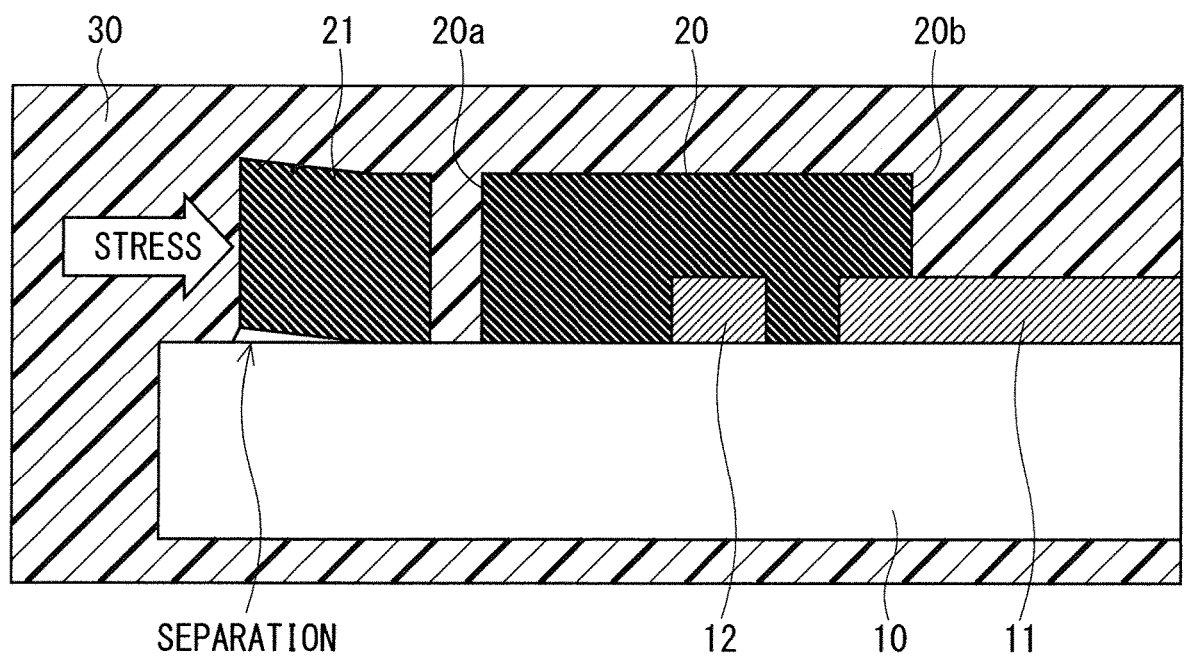

SEMICONDUCTOR DEVICE

TECHNICAL FIELD

The present invention relates to a semiconductor device, and, in particular, to a semiconductor device sealed in a package formed of a resin and the like.

BACKGROUND ART

A power device as a power control semiconductor device is used widely in the fields of consumer electronics, electric vehicles, railroad, and the like to the fields of solar and wind power generation attracting attention as generation of the so-called "renewable energy".

The power device is conventionally used with a semiconductor element containing silicon as a main material being sealed in a package formed of a resin and the like. However, improvement in properties of the semiconductor element containing silicon as the main material is approaching its limit. There is an ongoing shift to a power device including a semiconductor element containing, as a main material, a wide bandgap semiconductor, such as silicon carbide (SiC), having a higher value of properties, such as a bandgap and thermal conductivity, than silicon in recent years.

Patent Documents 1 and 2 below disclose a semiconductor device including a semiconductor substrate (semiconductor chip) on which a semiconductor element has been formed, a protective film to protect a region of formation of the element, and an annular protective film surrounding the protective film, for example. In particular, Patent Document 1 shows a configuration in which the annular protective film has a substantially triangular shape at each of corners of the semiconductor chip.

PRIOR ART DOCUMENTS

Patent Documents

Patent Document 1: Japanese Patent Application Laid-Open No. 2011-216753
Patent Document 2: Japanese Patent Application Laid-Open No. 63-037623

SUMMARY

Problem to be Solved by the Invention

When a semiconductor device having a configuration in which a semiconductor element is sealed in a package formed of a resin and the like is used in a widely varying temperature environment, stress is caused by a difference in coefficient of linear expansion among components including a semiconductor substrate on which the semiconductor element has been formed, an electrode, a wire, and a protective film formed on the semiconductor substrate, and a resin package to seal these components. The stress is likely to be concentrated on each of corners of the semiconductor substrate, and thus separation of the protective film due to the stress is likely to be caused at the corner of the semiconductor substrate. If separation of the protective film reaches the wire, a portion of the wire slides in a direction of the stress to cause a short circuit with another wire, an electrode, and the like.

The present invention has been conceived to solve a problem as described above, and it is an object of the present invention to provide a semiconductor device capable of suppressing stress concentration on each of corners of a semiconductor substrate.

Means to Solve the Problem

A semiconductor device according to the present invention includes: a semiconductor substrate; an electrode or a wire disposed on the semiconductor substrate; a main protective film disposed on the semiconductor substrate to cover the electrode or the wire, and having a chamfer at each of corners of the semiconductor substrate in plan view; and a dummy protective film independently disposed at each of the corners of the semiconductor substrate, and disposed outside the chamfer to be spaced from the main protective film.

Effects of the Invention

According to the semiconductor device according to the present invention, the main protective film is chamfered at each of the corners of the semiconductor substrate, so that a distance from the center of the semiconductor substrate to the end of the main protective film is reduced to suppress stress applied to the main protective film.

Furthermore, the dummy protective film disposed at each of the corners of the semiconductor substrate absorbs and distributes stress, so that stress applied to the main protective film is equalized to suppress stress concentration.

The objects, features, aspects, and advantages of the present invention will become more apparent from the following detailed description and the accompanying drawings.

BRIEF DESCRIPTION OF DRAWINGS

FIG. 1 is a top view of a semiconductor device according to Embodiment 1 of the present invention.

FIG. 3 is a diagram for describing the effects produced by the semiconductor device according to Embodiment 1 of the present invention.

DESCRIPTION OF EMBODIMENTS

Figure 2:
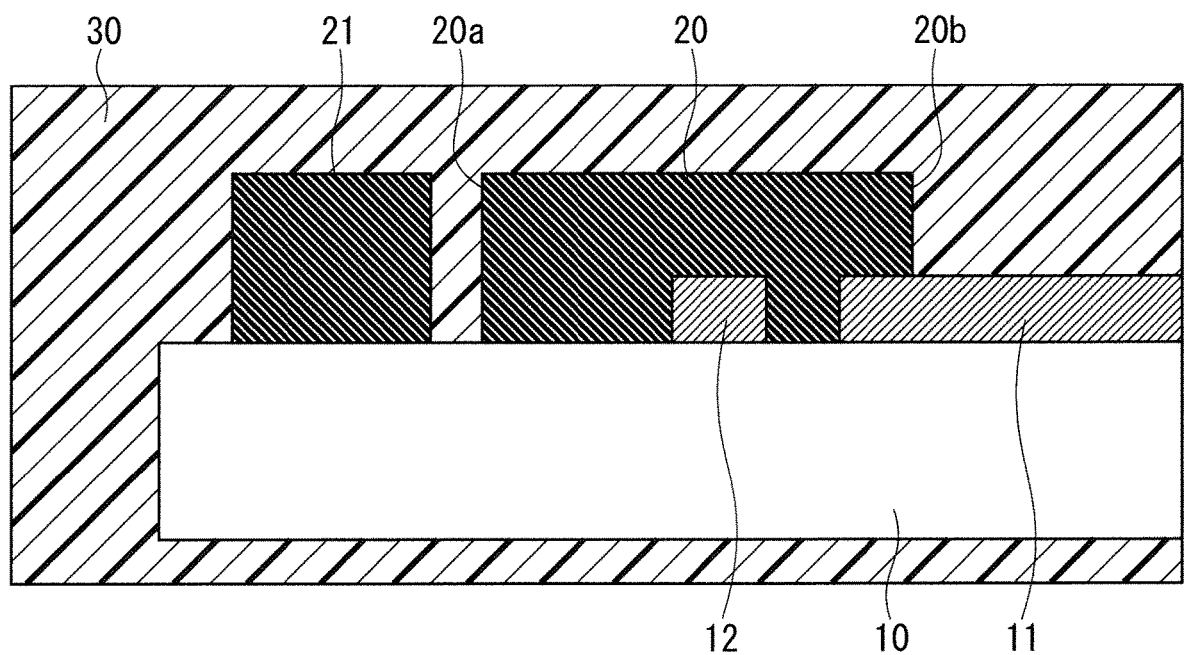
FIG. 2 is a cross-sectional view of the semiconductor device according to Embodiment 1 of the present invention at a corner thereof.

Embodiments of the present invention will be described. The drawings below show examples of a configuration of a semiconductor device, and the configuration of the semiconductor device is not limited to configurations shown in the drawings.

Embodiment 1

FIGS. 1 and 2 are diagrams showing a configuration of a semiconductor device according to Embodiment 1 of the present invention. FIG. 1 is a top view of the semiconductor device, and FIG. 2 is a cross-sectional view of the semiconductor device at a corner thereof. FIG. 2 corresponds to a cross section taken along a line A1-A2 shown in FIG. 1, and the line A1-A2 is located on a straight line passing through a center O and the corner of the semiconductor device.

As shown in FIGS. 1 and 2, the semiconductor device according to Embodiment 1 includes a semiconductor substrate 10, and an electrode 11 and a wire 12 formed of metal on the semiconductor substrate 10. A protective film formed of polyimide and the like is formed on the surface of the semiconductor substrate 10, and the protective film includes a main protective film 20 covering at least portion of the electrode 11 and at least portion of the wire 12 and a dummy protective film 21 formed at each of corners 10a of the semiconductor substrate 10. The semiconductor device is sealed in a resin 30 (hereinafter, referred to as a "package resin 30") forming a package, which is not illustrated in FIG. 1.

As illustrated in FIG. 1, the main protective film 20 is chamfered at each of the corners 10a of the semiconductor substrate 10 in plan view. A chamfered portion of the main protective film 20 is hereinafter referred to as a "chamfer 20a". The chamfer 20a has two vertices in plan view in Embodiment 1, but may have two or more vertices. The main protective film 20 has an opening 20b over the electrode 11, and a wire and the like (not illustrated) are connected to the electrode 11 through the opening 20b. The main protective film 20 covers substantially the entire surface of the semiconductor substrate 10 except for the corners 10a of the semiconductor substrate 10 and the opening 20b.

The dummy protective film 21 is independently formed at each of the corners 10a of the semiconductor substrate 10. That is to say, the dummy protective film 21 is locally formed at each of the corners 10a of the semiconductor substrate 10. The dummy protective film 21 is disposed outside the chamfer 20a of the main protective film 20 to be spaced from the main protective film 20. The dummy protective film 21 does not cover the electrode 11 and the wire 12. In Embodiment 1, the dummy protective film 21 has a triangular shape having two sides along the corner 10a of the semiconductor substrate 10 and one side along the chamfer 20a of the main protective film 20 in plan view.

Stress is applied from the package resin 30 to the semiconductor device by expansion and contraction of the semiconductor substrate 10 with varying temperature. An isostress plane is thus formed concentrically around the center O of the semiconductor substrate 10, and stress increases with increasing distance from the center O of the semiconductor substrate 10. In the semiconductor device in Embodiment 1, the main protective film 20 has the chamfer 20a at each of the corners 10a of the semiconductor substrate 10, so that a distance from the center O of the semiconductor substrate 10 to the end of the main protective film 20 is reduced to reduce stress applied to the main protective film 20. The chamfer 20a has two or more vertices to ease an edge at each of corners of the main protective film 20, to thereby relieve stress concentration. The main protective film 20 has the chamfer 20a, so that a space for the dummy protective film 21 is secured.

The dummy protective film 21 is disposed at each of the corners 10a of the semiconductor substrate 10 which is remote from the center O of the semiconductor substrate 10 and on which stress is likely to be concentrated, and is spaced from the main protective film 20. The dummy protective film 21 does not cover the electrode 11 and the wire 12, and thus does not cause a major problem if deformed and partially separated by stress as shown in FIG. 3. The dummy protective film 21 can absorb stress by being deformed, and can thus relieve stress applied to the main protective film 20.

Figure 4:
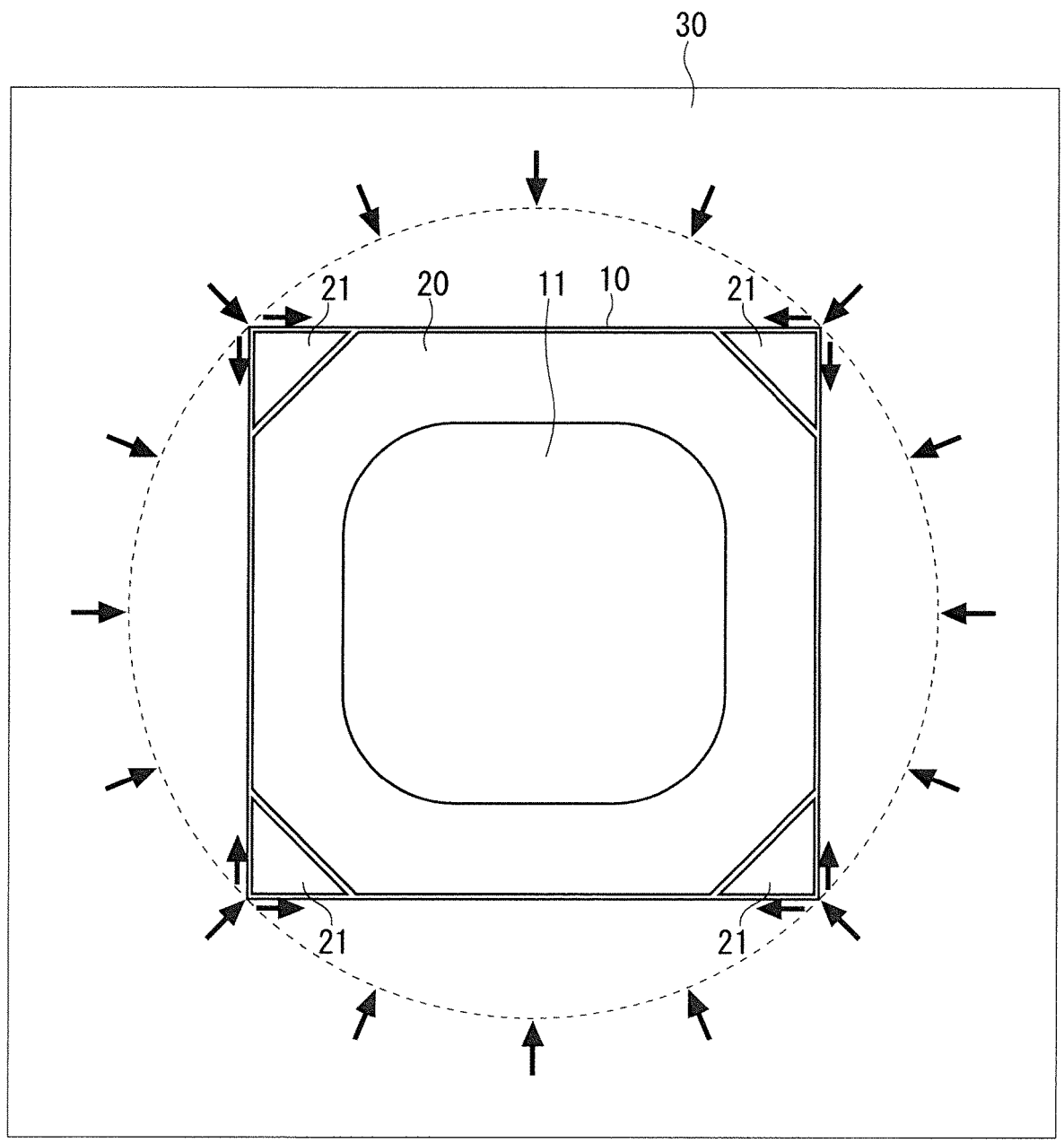
FIG. 4 is a diagram for describing the effects produced by the semiconductor device according to Embodiment 1 of the present invention.

The dummy protective film 21 is locally formed at each of the corners 10a of the semiconductor substrate 10. The dummy protective film 21 thus acts to distribute relatively high stress applied to each of the corners 10a of the semiconductor substrate 10 to sides of the semiconductor substrate 10 to which relatively low stress is applied, as shown in FIG. 4. Thus, stress applied to the main protective film 20 can be equalized while stress concentration is relieved.

As described above, according to the semiconductor device according to Embodiment 1, the dummy protective film 21 absorbs and distributes stress applied to each of the corners 10a of the semiconductor substrate 10, so that suppression and equalization of stress applied to the main protective film 20 are achieved, and separation of the main protective film 20 from the semiconductor substrate 10 can be prevented. The wire 12 is thus prevented from sliding with separation of the main protective film 20, and causing a short circuit with the electrode 11 and another wire (not illustrated). Even if the main protective film 20 is partially separated, time until separation reaches the wire 12 can be lengthened. This can contribute to improvement in reliability of the semiconductor device.

A distance from the center O of the semiconductor substrate 10 to the chamfer 20a of the main protective film 20 is preferably as short as possible. That is to say, the chamfer 20a of the main protective film 20 is preferably as close as possible to the center O of the semiconductor substrate 10 to the extent that the desired function of the main protective film 20 can be secured, for example, to the extent that the wire 12 is not exposed from the main protective film 20. Stress applied to the main protective film 20 can be reduced with decreasing distance from the center O of the semiconductor substrate 10 to the chamfer 20a. Furthermore, a space for the dummy protective film 21 increases with decreasing distance from the center O of the semiconductor substrate 10 to the chamfer 20a, so that the dummy protective film 21 can be increased in size to improve an ability of the dummy protective film 21 to absorb and distribute stress.

Herein, a main material for the semiconductor substrate 10 may be silicon as is conventional, or may be a wide bandgap semiconductor, such as silicon carbide, a gallium nitride-based material, and diamond. For example, silicon carbide has a higher Young's modulus and higher rigidity than silicon, and thus the semiconductor substrate 10 formed of silicon carbide is less likely to be deformed even under stress from the package resin 30. It is thus considered that more stress is applied to the main protective film 20, the dummy protective film 21, and the like formed on the semiconductor substrate 10 in a case where the semiconductor substrate 10 is formed of silicon carbide compared with a case where the semiconductor substrate 10 is formed of silicon. It can thus be said that the above-mentioned effect obtained by the dummy protective film 21 absorbing and distributing stress is particularly effective in a case where the semiconductor substrate 10 is formed of silicon carbide having a high Young's modulus.

Embodiment 2

Figure 5:
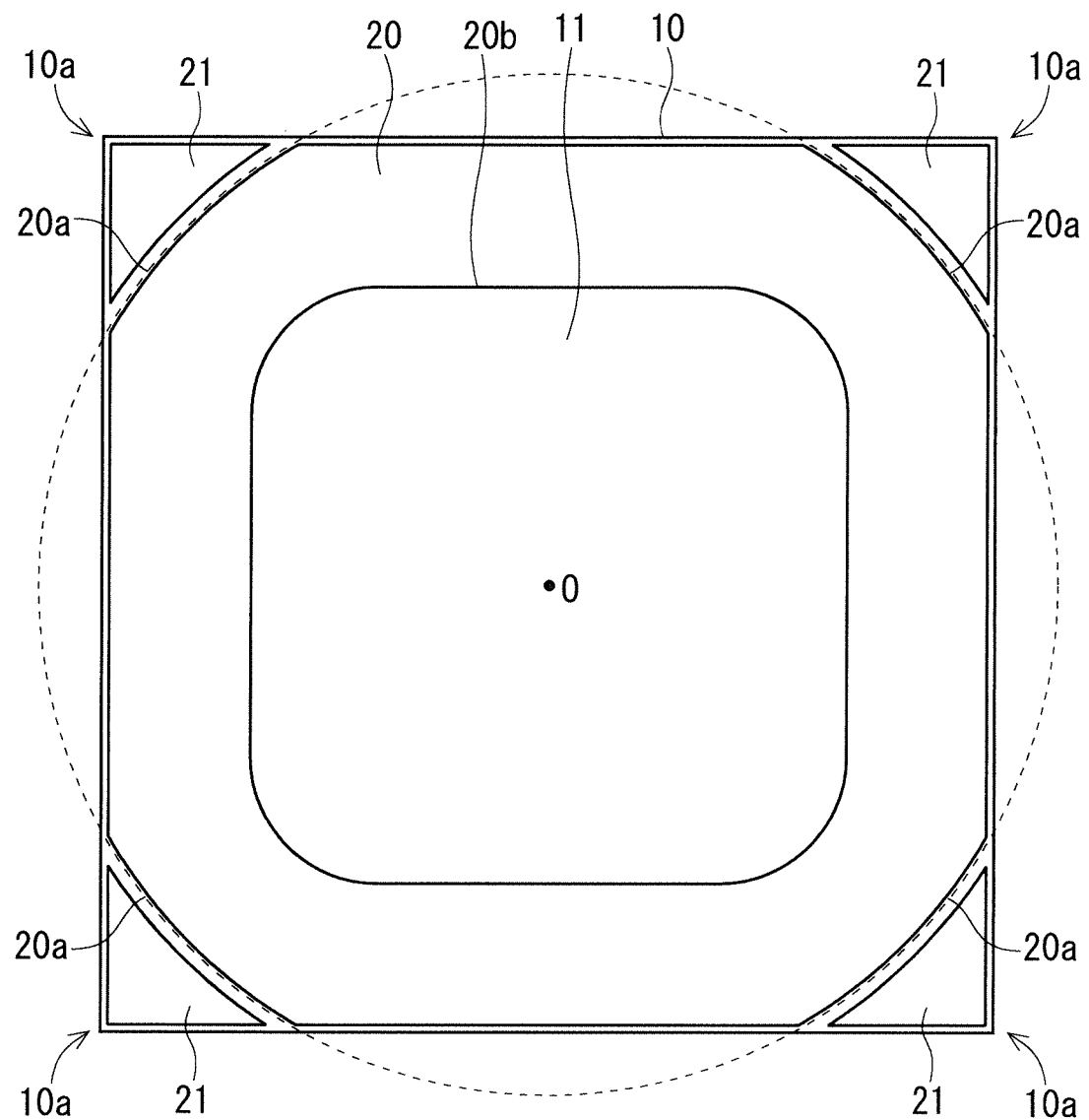
FIG. 5 is a top view of a semiconductor device according to Embodiment 2 of the present invention.

FIG. 5 is a diagram showing a configuration of a semiconductor device according to Embodiment 2, and is a top view of the semiconductor device. The semiconductor device has a similar cross-sectional structure to that shown in FIG. 2. As shown in FIG. 5, in Embodiment 2, the chamfer 20a of the main protective film 20 is curved (arcuate) along a circumference of a circle centered at the center O of the semiconductor substrate 10 in plan view.

A similar effect to that obtained in Embodiment 1 can be obtained in the semiconductor device in Embodiment 2. Since the chamfer 20a of the main protective film 20 is arcuate around the center O of the semiconductor substrate 10, an outer periphery of the main protective film 20 is substantially parallel to the isostress plane, and thus the effect of equalizing stress applied to the chamfer 20a can be produced.

Also in Embodiment 2, the distance from the center O of the semiconductor substrate 10 to the chamfer 20a of the main protective film 20 is preferably as short as possible. Stress applied to the main protective film 20 can be reduced with decreasing distance from the center O of the semiconductor substrate 10 to the chamfer 20a of the main protective film 20. Furthermore, a space for the dummy protective film 21 increases, so that the dummy protective film 21 can be increased in size to improve an ability of the dummy protective film 21 to absorb and distribute stress.

Embodiment 3

The dummy protective film 21 is formed of the same material (e.g., polyimide) as the main protective film 20 in Embodiments 1 and 2, while a material having a higher Young's modulus than the main protective film 20 is used as a material for the dummy protective film 21 in Embodiment 3. That is to say, the dummy protective film 21 has a higher Young's modulus than the main protective film 20 in Embodiment 3.

By forming the dummy protective film 21 using a material having a high Young's modulus, rigidity of the dummy protective film 21 is increased, and thus stress applied to the main protective film 20 can effectively be relieved. Thus, the effect of relieving stress applied to the main protective film 20 can further be obtained compared with that in Embodiments 1 and 2.

In the present embodiment, two materials differing in Young's modulus are required as materials for the protective films. Materials for the protective films other than polyimide include a glass-based material. The glass-based material typically has a higher Young's modulus than polyimide, and thus, when these two materials are used as the materials for the protective films, the main protective film 20 is required to be formed using polyimide, and the dummy protective film 21 is required to be formed using the glass-based material.

A polyimide-based material includes a plurality of types of polyimide differing in composition, such as photosensitive polyimide, non-photosensitive polyimide, and polybenzoxazole (furthermore, photosensitive polyimide includes a plurality of types of photosensitive polyimide differing in composition). They have Young's moduli different depending on composition, and proportional to the curvature of an interatomic potential at an equilibrium interatomic distance. Thus, the present embodiment can be implemented using two types of polyimide-based materials differing in composition.

Embodiments of the present invention can freely be combined with each other, and can be modified or omitted as appropriate within the scope of the invention.

While the present invention has been described in detail, the foregoing description is in all aspects illustrative and not restrictive. It is therefore understood that numerous unillustrated modifications can be devised without departing from the scope of the invention.

EXPLANATION OF REFERENCE SIGNS 10 semiconductor substrate, 10a corner, 11 electrode, 12 wire, 20 main protective film, 20a chamfer, 20b opening, 21 dummy protective film, 30 package resin

The invention claimed is:

1. A semiconductor device comprising:
a semiconductor substrate;
an electrode or a wire disposed on the semiconductor substrate;
a main protective film disposed on the semiconductor substrate to cover the electrode or the wire, the main protective film having a chamfer at each of corners of the semiconductor substrate in plan view; and
a dummy protective film independently disposed at each of the corners of the semiconductor substrate, the dummy protective film being disposed outside the chamfer to be spaced from the main protective film.

2. The semiconductor device according to claim 1, wherein
the dummy protective film does not cover the electrode or the wire.

3. The semiconductor device according to claim 1, wherein
the chamfer has a shape having two or more vertices in plan view.

4. The semiconductor device according to claim 1, wherein
the chamfer has a shape along a circumference of a circle centered at a center of the semiconductor substrate in plan view.

5. The semiconductor device according to claim 1, wherein
the main protective film has an opening over the electrode.

6. The semiconductor device according to claim 1, wherein
the dummy protective film has a higher Young's modulus than the main protective film.

7. The semiconductor device according to claim 1, wherein
a material for the semiconductor substrate is a wide bandgap semiconductor.

8. The semiconductor device according to claim 7, wherein
the wide bandgap semiconductor comprises silicon carbide, a gallium nitride-based material, and diamond.

* * * * *